(12) United States Patent
Cho et al.

(10) Patent No.: US 11,182,457 B2
(45) Date of Patent: Nov. 23, 2021

(54) MATRIX-FACTORIZATION BASED GRADIENT COMPRESSION

(71) Applicant: INTERNATIONAL BUSINESS MACHINES CORPORATION, Armonk, NY (US)

(72) Inventors: Minsik Cho, Austin, TX (US); Vinod Muthusamy, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 16/367,952

(22) Filed: Mar. 28, 2019

(65) Prior Publication Data
US 2020/0311180 A1 Oct. 1, 2020

(51) Int. Cl.
*G06F 17/16* (2006.01)
*G06F 7/58* (2006.01)

(52) U.S. Cl.
CPC .............. *G06F 17/16* (2013.01); *G06F 7/582* (2013.01)

(58) Field of Classification Search
CPC .................................. G06F 17/16; G06F 7/582
See application file for complete search history.

(56) References Cited

U.S. PATENT DOCUMENTS

| 10,755,407 | B2 * | 8/2020 | Gros | G16H 50/70 |
| 2008/0183799 | A1 * | 7/2008 | Bobroff | G06F 9/45558 |
| | | | | 709/201 |
| 2017/0148431 | A1 | 5/2017 | Catanzaro et al. | |
| 2017/0300830 | A1 | 10/2017 | Kadav et al. | |
| 2018/0253646 | A1 | 9/2018 | Feng et al. | |
| 2020/0027556 | A1 * | 1/2020 | Xie | G16H 50/20 |
| 2020/0118000 | A1 * | 4/2020 | Schmidt | G06N 3/04 |

OTHER PUBLICATIONS

Dai et al., "Grow and Prune Compact, Fast, and Accurate LSTMs." arXiv preprint arXiv:1805.11797 (2018).
Denil et al. "Predicting Parameters in Deep Learning." Advances in neural information processing systems. 2013.
(Continued)

*Primary Examiner* — Michael D. Yaary
(74) *Attorney, Agent, or Firm* — Patricia E. Hong; Randy E. Tejada

(57) ABSTRACT

Matrix factorization based gradient compression may be applied to an allreduce operation to improve efficiency including the elimination of unnecessary meta data while maintaining accuracy in training of deep learning (DL) of Artificial Intelligence. This compression may include generating a predetermined matrix and a degree of data compression k as a dimension of the predetermined matrix for a plurality of computing nodes. Each computing node may receive a corresponding matrix of matrices to be allreduced, and each corresponding matrix may be decomposed into a plurality of non-fixed matrices and the predetermined matrix. The plurality of non-fixed matrices may be summed to provide an optimized matrix, which may be multiplied by the predetermined matrix to provide a result matrix. The optimized matrix may be designated as a predetermined matrix. These operations may be repeated until all of the matrices received by the computing nodes have been allreduced.

20 Claims, 9 Drawing Sheets

(56) References Cited

OTHER PUBLICATIONS

Wang et al. "ATOMO: Communication-efficient Learning via Atomic Sparsification." arXiv preprint arXiv:1806.04090 (2018).
Wangni, Jianqiao, "Gradient Sparsification for Communication-Efficient Distributed Optimization", arXiv preprint arXiv:1710.09854 (2017).
Shamir et al., "Communication-efficient distributed optimization using an approximate newton-type method." International conference on machine learning. 2014.
Rengli et al., "SparCML: High-Performance Sparse Communication for Machine Learning." arXiv preprint arXiv:1802.08021 (2018).
Yu, Dong et al.: "An Introduction to Computational Networks and the Computational Network Toolkit" Microsoft Technical Report MSR-TR-2014-112; v0.7: Mar. 19, 2015.
Lin et al., "Deep Gradient Compression: Reducing The Communication Bandwidth For Distributed Training" arXiv:1712.01887v2 [cs.CV] Feb. 2018.
Chen et al., "AdaComp: Adaptive Residual Gradient Compression For Data-Parallel Distributed Training" arXiv:1712.02679v1 [cs.LG] Dec. 7, 2017.
Dryden et al., "Communication Quantization for Data-Parallel Training of Deep Neural Networks" 2016 2nd Workshop on Machine Learning in HPC Environments.

* cited by examiner

FULL BIT-VECTOR REPRESENTATION:

| | 1 | 2 | 3 | 4 | 5 |
|---|---|---|---|---|---|
| VALUE | 0001 | 0000 | 0000 | 0101 | 0000 |

SPARSE BIT-VECTOR REPRESENTATION:

| INDEX | 1 | 4 |
|---|---|---|
| VALUE | 0001 | 0101 |

Initial results (caffe)

lenet, 2xP100+NCCL m=657 n=656

|  | accuracy | compression |
|---|---|---|
| base | 0.9901 | 0% |
| k=256 | 0.9906 | 60% |
| k=128 | 0.9893 | 80% |
| k=64 | 0.9886 | 90% |
| k=32 | 0.986 | 95% |
| k=16 | 0.9831 | 97% |
| k=8 | 0.9771 | 99% |

Resnet50 4X100+NCCL

- Baseline
  - Top1 73.5%, Top5 91.5%
- 50% (or 75% w/ fp16) compression
  - Top1 72.1%, Top5 90.6%

FIG. 7

MATRIX-FACTORIZATION BASED GRADIENT COMPRESSION

BACKGROUND

Gradient compression is a critical topic in deep learning, as it impacts the training performance and final accuracy. Leveraging sparsity in gradient compression leads to popular sparse-encoding based compression techniques, but it turns out that such sparse encoding is not desirable for allreduce-based data parallelism in large scale distributed deep learning.

SUMMARY

According to an aspect, there is provided a computer implemented method for matrix-factorization based gradient data compression for allreducing matrices from a plurality of computing nodes. This method may include generating a predetermined matrix and a degree of data compression k as a dimension of the predetermined matrix for the plurality of computing nodes; receiving by each computing node a corresponding matrix of the matrices to be allreduced; decomposing each corresponding matrix into a plurality of non-fixed matrices and the predetermined matrix; summing the plurality of non-fixed matrices to provide an optimized matrix, which is multiplied by the predetermined matrix to provide a result matrix; designating the optimized matrix as the predetermined matrix; and repeatedly performing the operations of receiving, decomposing, summing and designating until all of the matrices received by the computing nodes have been allreduced.

According to an aspect, there is provided a system including a device processor and a computer readable storage medium storing instructions that are executable by the device matrix factorization based gradient data compression for allreducing matrices from a plurality of computing nodes by generating a predetermined matrix and a degree of data compression k as a dimension of the predetermined matrix for the plurality of computing nodes; receiving by each computing node a corresponding matrix of the matrices to be reduced; decomposing each corresponding matrix into a plurality of non-fixed matrices and the predetermined matrix; summing the plurality of non-fixed matrices to provide an optimized matrix, which is multiplied by the predetermined matrix to provide a result matrix; designating the optimized matrix as the predetermined matrix; and repeatedly performing the operations of receiving, decomposing, summing and designating until all of the matrices received by the computing nodes have been allreduced.

According to an aspect, there is provided a computer implemented method for executing a sequence of summation operations of a distributed set of number sequences at computing nodes using matrix-factorization based gradient compression by processes. The method may include receiving by at least two processes P (P1, P2, ..., Pd) a degree of compression k, a set of numbers Gj for each process Pj, a pair of numbers m×n, where m×n equals a size of Gj; reshaping by each process Pj the set of numbers Gj as an m×n matrix; generating by each Pj, an m×k set numbers Uj wherein Uj is the same for at least two processes P(P1, P2, ..., Pd); decomposing by each Pj, Gj into Uj (m×k) and Vj (k×n) matrices in a way that the difference between Gj and Uj*Vj is minimized; adding the Vj to form a result V'=V1+V2+ ... +Vd and broadcasting (which is allreduce) the V' to the at least two processes P(P1, P2, ..., Pd); and calculating by each Pj, Uj*V' to provide G'=G1+G2+, ... +Gd to allreduce Gj as an approximation of directly performing allreduce Gj.

A method, system, and computer program product are provided for matrix-factorization based gradient data compression for reducing matrices from a plurality of computing nodes.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

FIG. 2A is a schematic diagram of a sparse encoding-based compression;

FIG. 2B is a schematic diagram of the application of an allreduce technique in conjunction with sparse encoding compression;

FIG. 7 is a table showing an example of the benefits of a matrix-factorization based gradient data compression technique applied to an allreduce operation.

DETAILED DESCRIPTION

Figure 1:
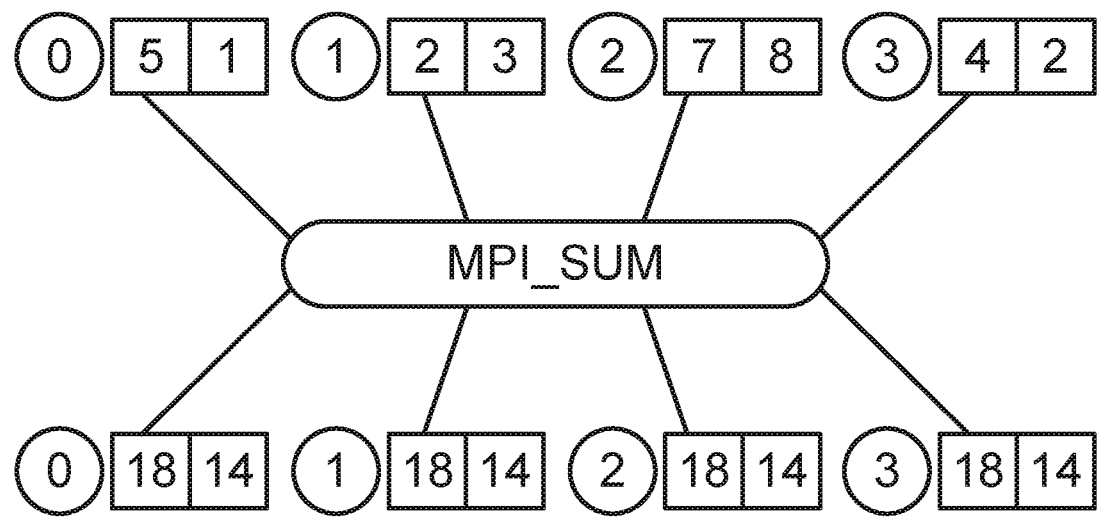
FIG. 1 is a schematic diagram of an allreduce technique (operation) applied to a message parsing interface.

This disclosure is intended to manage the potential inefficiencies of using the allreduce function (technique or operation) in conjunction with sparse encoding compression. As background, allreduce is a popular communication pattern used in deep learning. One exemplary description of the allreduce function is contained in US Patent Publication 2018/0357534 published on Dec. 13, 2018, the contents of which is hereby incorporated by reference. Allreduce will take a number array and row-by-row, perform an element-wise addition. This can be seen in FIG. 1 which illustrates four nodes 0, 1, 2, 3, the first number in each pair in the top line is summed and broadcast to all participants so that the sum, in this case "18" is shown as the first number in each pair in the bottom line. Allreduce is best used with data compression to save resources and manage data volume.

Another aspect of the background for this disclosure is the use of sparse encoding as the compression mechanism. Allreduce is frequently employed with sparse encoding compression. While this type of system is successfully used in many deep learning environments, one of the potential inefficiencies involves the fact that sparse encoding compression produces metadata that can require additional manipulation of the data. With reference to FIG. 2A, a simple illustration of sparse encoding is provided showing n numbers, in this case 5 numbers. This set can be represented by only the non-zero numbers. For example, in FIG. 2A, there are 5 numbers, and only the first and fourth number are non-zeros. Since all the rest are zeros, sparse encoding enables this set can be represented by values and indexes. The indices are metadata in sparse encoding. Sparse encoding compression may be employed in a deep learning environment where a gradient must be computed. In the gradient, the values are small, and there are many zeros. Therefore, the gradient is said to have a sparse representation. Sparse encoding is employed to reduce the volume of the data by omitting the zero values. By reducing the volume, network traffic, and therefore communication performance is enhanced.

FIG. 2B illustrates in simplified fashion why sparse encoding is not necessarily the best data compression for allreduce. The first column in FIG. 2B shows the number array corresponding to participant 1, and the second column in FIG. 2B shows the number array corresponding to participant 2. Participant 1 and participant 2 may be computing nodes. Each set of numbers has an index and values. In the original representation before sparse encoding compression each participant had the same size array, but after compression the resulting index and values shown in FIG. 2B demonstrates that each participant has different zero distributions, and therefore the metadata information will be different. In this case, because of the different numbers of index and value pairs, it is not feasible to simply use the allreduce operation as there is not a one-to-one correspondence. Specifically, participant 1 has a position 10 and a position 17, while participant 2 does not have a position 10, but does have a position 17. The best that can be done is to find where both participants share a position, 17 in this example, and add those values. This is one practical solution. However, it can be seen that allreduce does not support varying sizes during operation. Allreduce needs the sizes to be constant. Currently systems that employ sparse encoding with allreduce generally must decompress and then re-compress the data until they reach the same size. This is a resource intensive and resource expensive operation.

In this way, sparse encoding and allreduce, while used frequently together, is not ideal for efficient operation. As indicated above, it can be seen that allreduce does not support varying sizes during an operation. Allreduce needs the sizes to be constant. This is a recognized problem as indicated in the publication "Re: details on implementation of Deep Gradient Compression" in *ICLR* 2018 *Conference Paper* 833 *Official Comment*, which states, " . . . For All-reduce, since the sparse gradients may be of different size, the standard MPI All-reduce operation won't work for this . . . ."

Since allreduce is an essential operation, it would be beneficial to create a compression operation that is more compatible with allreduce. That is, a compression operation that does not result in metadata, but instead provides one to one correspondence to enable straight forward allreduce operation. This disclosure proposes employing matrix factorization for compression which eliminates metadata and works far better with allreduce.

More specifically, the present disclosure relates to the application of matrix-factorization based gradient compression to allreduce to improve efficiency (processing speed) including the elimination of unnecessary meta data while maintaining accuracy in training of deep learning (DL) of Artificial Intelligence. The matrix-factorization based gradient compression may be utilized in a cloud environment having a plurality of computing nodes where each computing node may be a computing device. Each computing node may have a memory.

Figure 3:
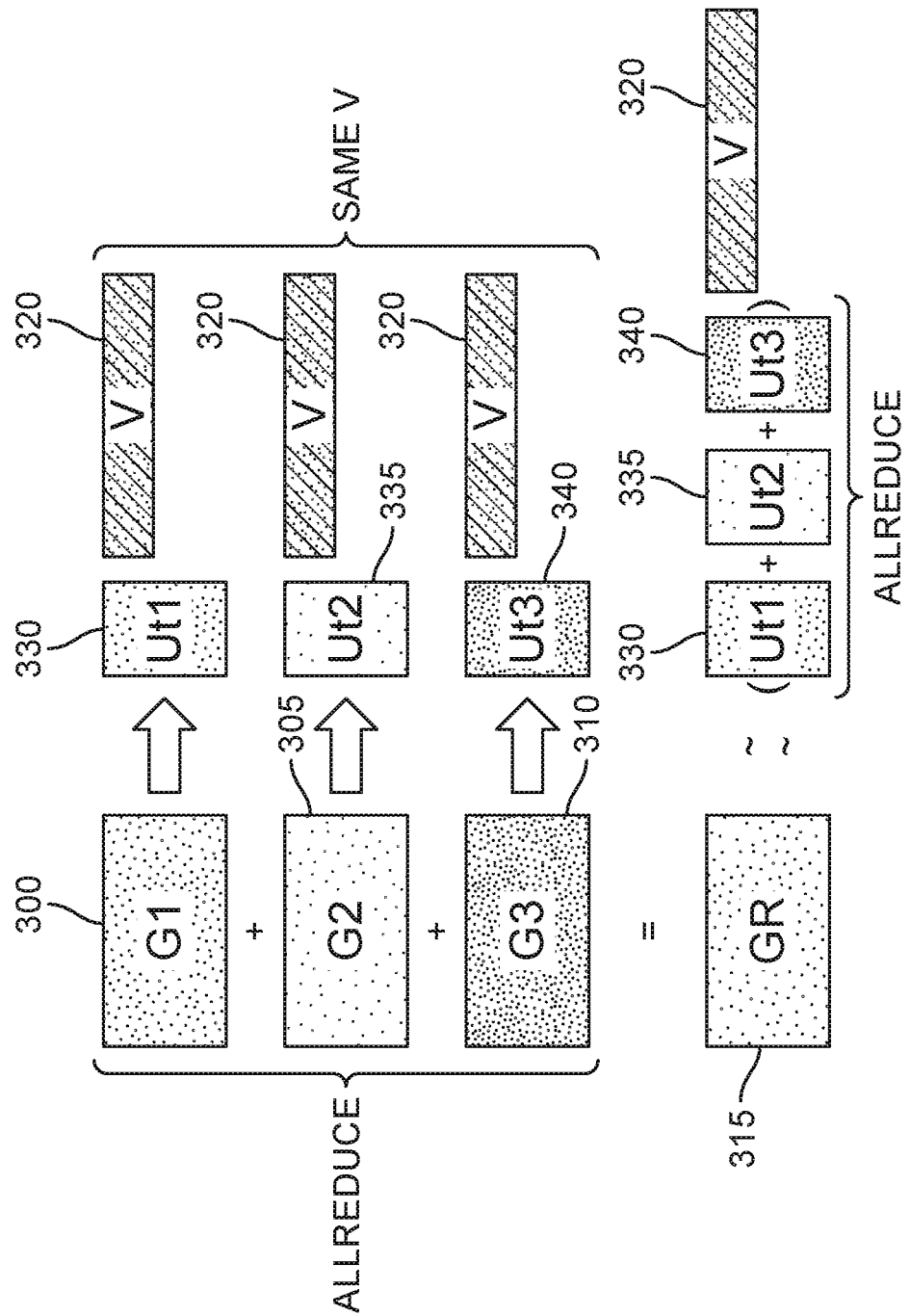
FIG. 3 is a schematic diagram of an embodiment for a matrix-factorization based gradient data compression technique applied to an allreduce operation.

FIG. 3 is a schematic diagram of an embodiment for a matrix-factorization based gradient data compression technique applied to an allreduce operation to enhance training of deep learning of artificial intelligence in parallel computing environments by maintaining accuracy and increasing efficiency, which includes increasing speed of data communication in this environment. This matrix-factorization based gradient data compression technique must be friendly to (compatible with) the allreduce operation by keeping the data size constant. Another advantage of this matrix-factorization based gradient data compression technique is that it is unnecessary to carry the meta data, which is an advantage over the sparse encoding-based compression technique (operation).

For example, FIG. 3 shows three number arrays (matrices) denoted by reference numerals 300, 305, and 310, which all have the same size (data size). It should be noted that these three number arrays are an example and two or more number arrays may be used. The first number array (first matrix) G1 is denoted by reference numeral 300. The second number array (matrix) G2 is denoted by reference numeral 305 and the third number array (matrix) G3 is denoted by reference numeral 310. The three number arrays (matrices) denoted by reference numerals 300, 305, and 310 are summed to produce a result array (result matrix) denoted by reference numeral 315 GR, which is the result of the allreduce operation, which provides a reduced result. A matrix V is denoted by reference numeral 320 and is a matrix with a predetermined set of numerical values.

Because the matrix V has a predetermined number array (matrix), the first matrix G1, the second matrix G2, and the third matrix G3 can be decomposed into a predetermined matrix V and a corresponding matrix (number array) denoted by reference numerals 330, 335, and 340 respectively. Reference numeral 330 denotes the matrix Ut1, reference numeral 335 denotes the matrix Ut2, and reference numeral 340 denotes the matrix Ut3. Because (1) the matrices Ut1, Ut2, and Ut3 are smaller (less volume due to less data in the matrices) than the corresponding matrices G1, G2, and G3 and (2) V is a known predetermined matrix which can be applied to Ut1, Ut2, and Ut3, an allreduce operation (technique) may be performed by summing the smaller matrices Ut1, U2t, and Ut3 and applying matrix V to provide a result matrix of reduced elements and to broadcast the result matrix back to all of the computing nodes as shown in FIG. 3. In the example shown in FIG. 3, matrix V denoted by reference numeral 320 can be multiplied by the sum of matrices Ut1, Ut2, and Ut3 denoted by reference numeral 350, so that the result matrix can then be broadcast to all the computing nodes. In the above operations, the meta data (e.g. index data) is not necessary for compression or decompression of data. Therefore, the above operations (techniques) are performed without the index meta data, which made sparse encoding-based data compression unfriendly to the allreduce technique. The above data compression operations shown in FIG. 3 are friendly to the allreduce technique, because there is no need to ascertain the index meta data.

In addition, it should be noted that matrix G1 can be reproduced by multiplying matrix Ut2 with matrix V. The matrix G2 can be reproduced by multiplying matrix Ut2 with matrix V. The matrix G3 can be reproduced by multiplying matrix Ut3 with matrix V. The matrix GR can be reproduced by multiplying the sum of matrices Ut1, Ut2, and Ut3 denoted by reference numeral 350 by matrix V, and can be referred to as a matrix with reduced results or a result matrix, which can be broadcast to all of the computing nodes. The reproduction of matrices G1, G2, G3, and GR will be very close reproductions of the original matrices G1, G2, G3, and GR. Therefore, FIG. 3 shows an embodiment for a matrix-factorization based gradient data compression technique applied to an allreduce operation, which increases efficiency (speed) of the allreduce operation by reducing the volume of data processed while providing a close reproduction of the original matrices to maintain accuracy.

In the above example in FIG. 3, the matrix V included a set of fixed predetermined values. Because the matrix V is fixed, the matrices for Ut1, Ut2, and Ut3 in FIG. 3 can be determined. Thereafter, the matrices of Ut1, Ut2, and Ut3, may be allreduced by summing these matrices, multiplying the summed matrix with matrix V to provide a result matrix, and then broadcasting the result matrix to all computing nodes. The computing nodes are the nodes associated with matrices G1, G2, and G3 respectively. Alternatively, a fixed matrix U may be provided for matrices G1, G2, and G3. Because the matrix U is fixed for matrix G1, matrix G2, and matrix G3, a matrix Vt1 corresponding to matrix G1, a matrix Vt2 corresponding to matrix G2, and matrix Vt3 corresponding to matrix G3 can be determined (not shown in FIG. 3). The matrices Vt1, Vt2, and Vt3 would have the same size but these matrices Vt1, Vt2, and Vt3 can have different values. The matrices Vt1, Vt2, and Vt3 can be summed and the summation result may be multiplied by the fixed matrix U to provide a result matrix with reduced elements. The result matrix could be broadcast to all the computing nodes. The computing nodes are the nodes associated with matrices G1, G2, and G3 respectively.

Figure 4:
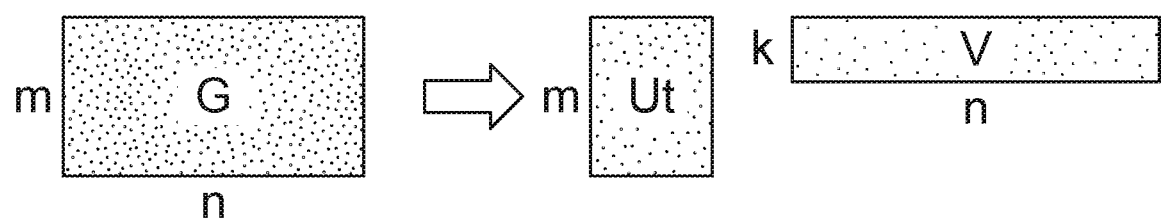
FIG. 4 is a schematic diagram of an embodiment for a matrix-factorization based gradient data compression technique applied to an allreduce operation.

FIG. 4 is schematic diagram showing another aspect of a matrix-factorization based gradient data compression operation (technique). Although FIG. 4 shows one example of matrix-factorization based compression operation friendly with the allreduce operation, many matrix-factorization based compression operations compatible with the allreduce operations are also contemplated.

Referring to FIG. 4, a matrix G, a matrix Ut and a matrix V are shown as representative matrices. However, in the matrix-factorization based data compression operation shown in FIG. 4, there are a plurality of matrices G. One set of the matrices G may have corresponding matrices Ut (not-fixed) and a corresponding fixed matrix V. Another set of the matrices G may have corresponding matrices Vt (not-fixed) and a corresponding fixed matrix U. The letter m denotes the number of rows in the matrix G and matrix Ut. The letter n denotes the number of columns in the matrix G and the matrix.

The letter k is the dimension of the matrix to factorize, and k determines the data compression ratio. More specifically, the letter k is the rank size to represent the gradient matrix, and controls the data compression ratio. As k becomes smaller, the data compression ratio increases, which reduces accuracy. As k becomes larger, the data compression ratio decreases, which increases accuracy. Each data set/data model to be processed may have a different k. However, there is no way to determine k systematically. Because a small k value provides better data compression as discussed above, the smallest k value that captures the gradient matrix well (good accuracy) is determined.

With reference to FIG. 3 and FIG. 4, the matrix-factorization based gradient compression operation requires a predetermined matrix U (fixed matrix U) or a predetermined matrix V (fixed matrix V), which must be the same predetermined matrix for each corresponding computing node, which stores a corresponding matrix G. In order to provide the same predetermined matrix U or the same predetermined matrix V, the matrix-factorization based compression operation may randomly generate a predetermined matrix U or a predetermined matrix V based on a random seed, which would correspond to all matrices G. It should be noted that one set matrices G may have a corresponding predetermined U matrix and another set of matrices G may have a corresponding predetermined V matrix.

For example, in FIG. 4, the matrix-factorization based compression operation may randomly generate a predetermined matrix V based on a random seed for a set of matrices G. The predetermined matrix V is fixed. After the predetermined matrix V is determined, the corresponding matrix Ut for each matrix G of the set of matrices G can be determined. After the V matrix is determined, allreduce is applied to all of the matrices Ut to provide an allreduce matrix U with reduced values for U, and the allreduce matrix U can be multiplied by the fixed predetermined matrix V to provide the result matrix GR (not shown).

In FIG. 4, the matrix-factorization based compression operation may randomly generate a predetermined matrix U based on a random seed for another set of matrices G. The predetermined U matrix is fixed. After the predetermined matrix U is determined, the corresponding Vt matrix for each matrix G of the another set of matrices G can be determined. Allreduce is applied to all of the matrices Vt to provide an allreduce matrix V with reduced values for V, and the allreduce matrix V can be multiplied by the fixed matrix U to provide the result matrix GR.

As shown in FIG. 4, there is a benefit for pursing an alternating scheme of generating a predetermined matrix U for a set of matrices G and generating a predetermined matrix V for the next set of matrices G, which is repeatedly performed. As shown in FIG. 4, predetermined matrix U may be randomly generated for a first set of matrices G. Since matrix U is fixed for the first set of G matrices, this permits matrices V to be determined and allreduced to optimize the matrix V to be applied to the first set of matrices G. The optimized matrix V may be fixed for a second set of G matrices, which permits matrices U to be determined and allreduced to optimize the matrix U to be applied to the second set of matrices G. A predetermined U matrix and a predetermined V matrix may be repeatedly optimized until all matrices G are processed. It should be noted that the process may have been started by randomly generating a predetermined matrix V for the first set of matrices instead of randomly generating the predetermined matrix U. However, once the first predetermined matrix is randomly generated, the alternate optimization of the fixed matrix repeatedly takes place. The benefits of pursuing this alternating scheme may include a closed form solution, capture correlation, and easy data compression and may be mathematically represented in the following manner. This alternating scheme may be mathematically represented by the following equations shown in FIG. 4.

$$\text{Argmin} \|G - UtV\|^2$$

$$(UUt + aI)V = UG \ (U \text{ fixed})$$

$$(VVt + aI)U = VGt \ (V \text{ fixed})$$

LU Decomposition

Traffic: mn vs max(mk, nk)

With respect to FIG. 4, it should be noted that the dimensions of matrices shown in FIG. 4 include m, n, and k, which are whole numbers greater than or equal to one.

As indicated above, there is a benefit for pursing an alternating scheme of generating a predetermined matrix U for a set of matrices G and generating a predetermined matrix V for the next set of matrices G, which is repeatedly performed. However, there are also at least two alternative embodiments. For example, with reference to FIG. 4. a random fixed matrix V may be generated and stored as a fixed matrix V. A corresponding matrix Ut may be generated for each matrix G from a participating set of computing nodes based on a fixed matrix V. The matrices Ut are added (summed) to generate matrix UR, and the matrix UR is multiplied by the matrix V to provide a matrix with reduced values. By repeatedly using the stored fixed matrix V. a corresponding matrix Ut may be generated for each matrix G from a participating set of computing nodes based on the fixed matrix V until learning is completed. In an alternative embodiment, a random fixed matrix U may be generated and stored as a fixed matrix U. A corresponding matrix Vt may be generated for each matrix G from a participating set of computing nodes based on a fixed matrix U. The matrices Vt are added (summed) to generate matrix VR, and the matrix VR is multiplied by the matrix U to provide a matrix with reduced values. By repeatedly using the stored fixed matrix U. a corresponding matrix Vt may be generated for each matrix G from a participating set of computing nodes based on the fixed matrix U until learning is completed.

Figure 5A:
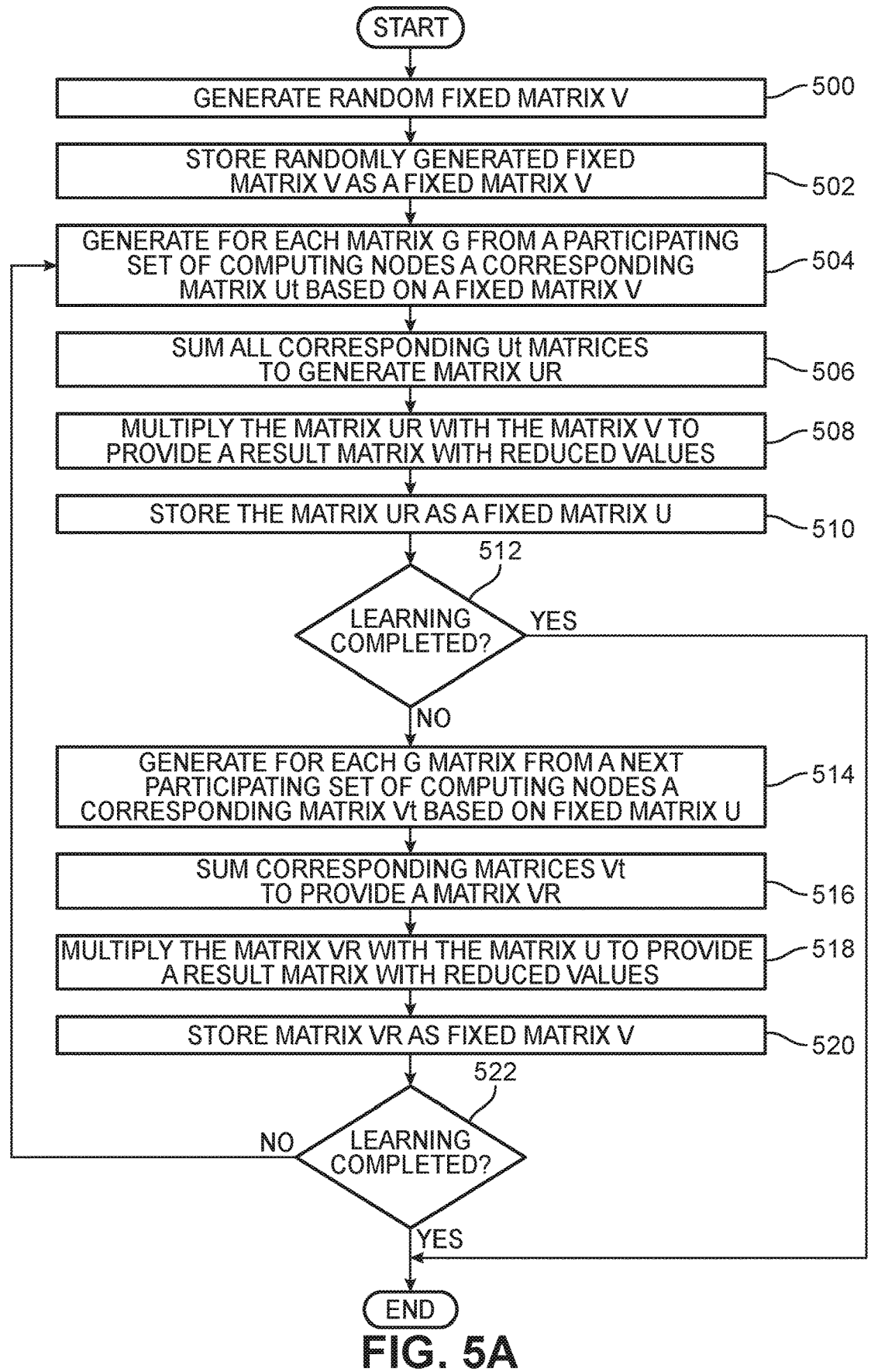
FIGS. 5A-5B are flowcharts of an embodiment for a matrix factorization; based gradient data compression technique applied to an allreduce operation.
Figure 5B:
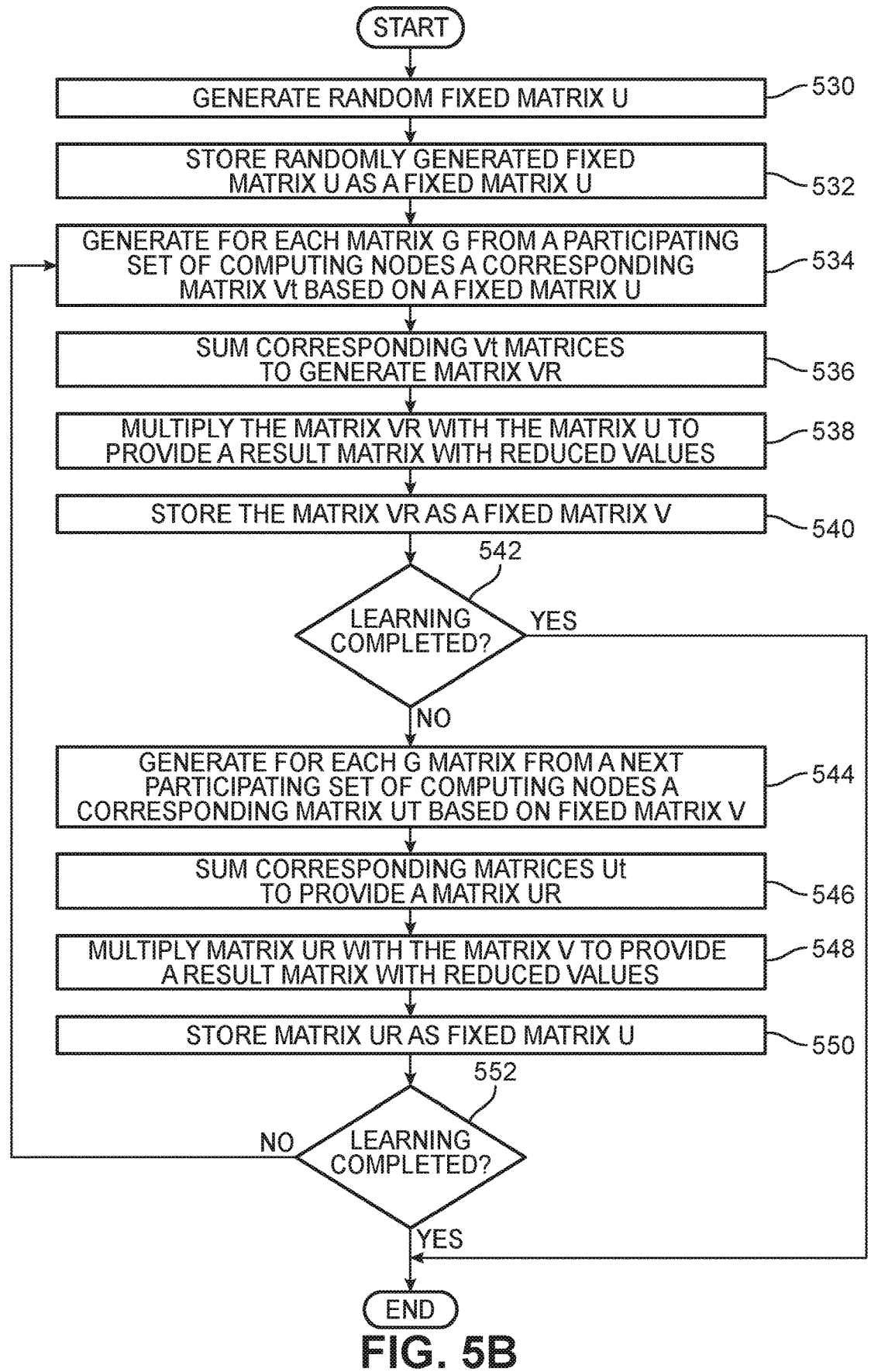

As indicated above, there is a benefit for pursing an alternating scheme of generating a predetermined matrix U for a set of matrices G and generating a predetermined matrix V for the next set of matrices G, which is repeatedly performed. FIGS. 5A-5B are flowcharts of an embodiment for a matrix factorization based gradient data compression technique applied to an allreduce operation with U and V being alternately fixed so that Vt and Ut may be alternately optimized. Referring to FIG. 5A, a random fixed matrix V may be generated (operation 500) and store the randomly generated fixed matrix V as a fixed matrix V (operation 502). A corresponding matrix Ut may be generated for each matrix G from a participating set of computing nodes based on a fixed matrix V (operation 504). The matrices Ut are added (summed) to generate matrix UR (operation 506), and the matrix UR is multiplied by the matrix V to provide a matrix with reduced values (operation 508). The matrix UR is stored as a fixed matrix U (operation 510). If the learning (training) for artificial intelligence is completed, the allreduce operation(s) is/are completed, so that the operations end (operation 512). If the learning (training) for artificial intelligence continues because there are more G matrices from participating nodes to process by applying matrix-factorization based compression operations (operation 522), a corresponding matrix Vt may be generated for each matrix G from a participating set of computing nodes based on a fixed matrix U (operation 514). The matrices Vt are added (summed) to generate Matrix VR (operation 516), and the matrix VR is multiplied by fixed matrix U to provide a result matrix with reduced values (operation 518). The matrix VR is stored as a fixed matrix V (operation 520). If the learning (training) for artificial intelligence is completed, the allreduce operation(s) is/are completed, so that the operations end (operation 522). If the learning (training) for artificial intelligence continues because there are more G matrices from participating nodes to process by applying matrix-factorization based compression operations, the process returns to operation 504 to process the next set of G matrices until the process is complete (operation 522).

In an alternative embodiment shown in FIG. 5B, a random fixed matrix U may be generated (operation 530) and store the randomly generated fixed matrix V as a fixed matrix U (operation 532). A corresponding matrix Vt may be generated for each matrix G from a participating set of computing nodes based on a fixed matrix U (operation 534). The matrices Vt are added (summed) to generate matrix VR (operation 536), and the matrix VR is multiplied by the matrix U to provide a matrix with reduced values (operation 538). The matrix VR is stored as a fixed matrix V (operation 540). If the learning (training) for artificial intelligence is completed, the allreduce operation(s) is/are completed, so that the operations end (operation 542). If the learning (training) for artificial intelligence continues because there are more G matrices from participating nodes to process by applying matrix-factorization based compression operations (operation 542), a corresponding matrix Ut may be generated for each matrix G from a participating set of computing nodes based on a fixed matrix V (operation 544). The matrices Ut are added (summed) to generate Matrix UR (operation 546), and the matrix UR is multiplied by fixed matrix V to provide a result matrix with reduced values (operation 548). The matrix UR is stored as a fixed matrix U (operation 550). If the learning (training) for artificial intelligence is completed, the allreduce operation(s) is/are completed, so that the operations end (operation 552). If the learning (training) for artificial intelligence continues because there are more G matrices from participating nodes to process by applying matrix-factorization based compression operations, the process returns to operation 534 to process the next set of G matrices until the process is complete (operation 552).

Figure 6:
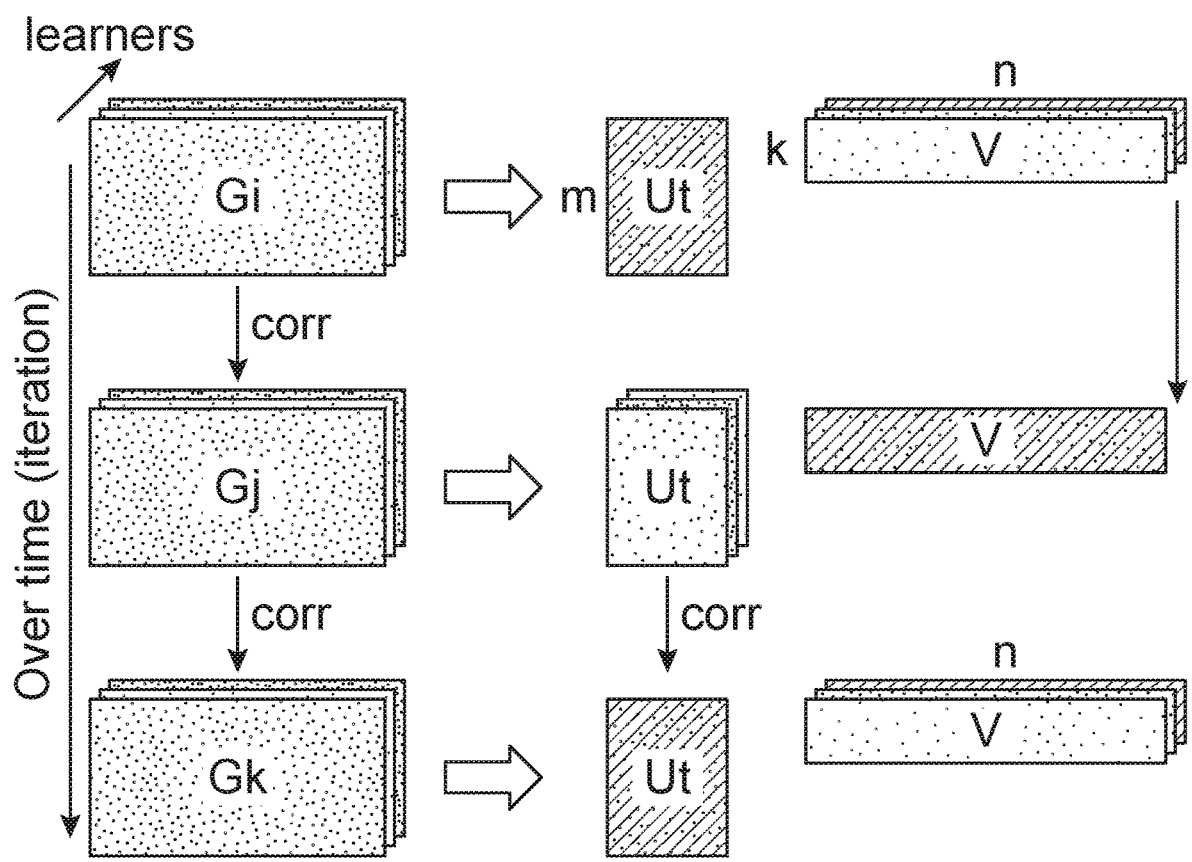
FIG. 6 is a schematic diagram of an embodiment for a matrix-factorization based gradient data compression technique applied to an allreduce operation.

FIG. 6 is a schematic diagram showing the toggling of the vectors U and V in FIGS. 5A-5B. The above operations of alternately utilizing a fixed Ut matrix and optimizing a matrix V followed by utilizing a fixed matrix V and optimizing a Ut matrix are shown in FIG. 6. For example, FIG. 6 shows three sets of matrices G including a first set of matrices Gi, a second set of matrices Gj, and a third set of matrices Gk. As shown in FIG. 6, the matrix Ut corresponds to all matrices Gi and each matrix Gi corresponds to a matrix V, which is not fixed. The matrices V are allreduced to provide an optimized matrix V, which can be multiplied by matrix Ut to provide the sum of the matrices Gi to provide a matrix with reduced results. The optimized V matrix corresponds to all matrices Gj and each matrix Gj corresponds to a matrix Ut, which is not fixed. The matrices Ut are allreduced to provide an optimized matrix Ut, which can be multiplied by matrix V to provide the sum of matrices Gj to provide a matrix with reduced results. The optimized matrix Ut matrix corresponds to all matrices Gk and each matrix Gk corresponds to a matrix V, which is not fixed. The matrices V are allreduced to provide an optimized matrix V, which can be multiplied by matrix Ut to provide the sum of matrices Gk to provide a matrix with reduced results. As indicated in FIG. 6, the benefits of this alternating scheme provide a closed form solution for compression and decompression, a correlation between successive G matrices is captured by reusing U or V, and all information such as meta data does not required to be transferred as the G matrices are correlated.

As shown in the exemplary embodiment in FIG. 6, one or more embodiments may increase the speed of a sequence of summation operations of a distributed set of number sequences using lossy compression. This process may include receiving by at least two processes P (P1, P2, ..., Pd) a degree of compression k, a set of numbers Gj for the each process Pj, a pair of number m and n, where m×n=the size of Gj; reshaping by the each process Pj the set of numbers Gj as a m×n matrix; generating by the each Pj, an m×k set numbers Uj wherein Uj is the same for the at least two processes P (P1, P2, ..., Pd); decomposing by each Pj, Gj into Uj (m×k) and Vj (k×n) matrices in a way that the difference between Gj and Uj*Vj is minimized; adding the Vj and to form a result V'=V1+V2+ ... +Vd and broadcasting the V' to the at least two processes P (P1, P2, ..., Pd) [allreducing Vi]; and calculating by the each Pj, Uj (which is identical)*V' to get G'=G1+G2+ ... +Gd [allreducing Gi].

As discussed above, the letter k is the rank size to represent the gradient matrix, and controls the data compression ratio. As k becomes smaller, the data compression ratio increases, which reduces accuracy. As k becomes larger, the data compression ratio decreases, which increases accuracy. Each data set/data model to be processed may have a different k. However, there is no way to determine k systematically. Because a small k value provides better data compression as discussed above, the smallest k value that captures the gradient matrix well (good accuracy) is determined. FIG. 7 is a table showing an example of the benefits of a matrix-factorization based gradient data compression technique applied to an Allreduce operation by determining the smallest k value that captures the gradient matrix well.

One exemplary application of this type of compression method with allreduce is in a DL cloud environment. In these environments, it is possible to have an imbalance of network bandwidth, and bottlenecks can form. Compression is useful when the network is potentially bottlenecked. With the choice of k, the amount of compression is controlled depending on the extent of network bottleneck. It is too resource intensive and potentially expensive to run the G matrix through all machines. It would be helpful to have an allreduce friendly compression. The tradeoff is that increasing compression to save network resources could result in a reconstruction of the G matrix that will have more error. Therefore, the accuracy of the training will decrease. Tradeoff between network bandwidth that is needed and convergence and accuracy of the model. Put simply, the choice of k is a way to manage that tradeoff. This will depend on how busy the network is and how much traffic is flowing through the network. If the cloud is not as busy, it is possible to use a higher value for k and have minimum compression resulting in better accuracy. However, if the cloud is busy with thousands of customers online, the cloud provider may decide to manage k, that is, make the k value smaller, so all users will use the available network bandwidth, but experience more compression and therefore decreased accuracy. The value of k is a control on network performance factoring in the bandwidth and system usage. This may enable the cloud provider to host more customers beyond the design of the actual infrastructure and provides a way to save costs by avoiding or delaying the need to upgrade the network while taking a small tradeoff in accuracy.

In this fashion, employing matrix factorization compression provides the advantage of eliminating metadata as described above, and also enables synchronization of one of the matrices across learners without additional communication thereby reducing the load on compute resources. In addition, initializing the matrices in the first iteration, and then alternating which matrix to fix in subsequent iterations enables more efficient operation. Overall, the methods described herein address the balancing of the competing parameters of how compression affects model convergence, and determining how much compression to apply and the optimal point to apply compression. Heretofore, most of the compression employed in deep learning has focused on compressing models for inferencing rather than training. Common techniques for model compression for inferencing such as filter pruning, weight pruning, and quantization may not be deemed applicable for training. Research has typically attempted to apply these techniques to training, which is not compatible with allreduce. In the past, the bottleneck in these types of systems was the compute, and network bandwidth was usually sufficient to not require compression. Prospectively, this is less likely to remain the bottleneck as compute speeds up and in cloud environments for example, the network links must be shared.

It is to be understood that although this disclosure includes a detailed description for to matrix-factorization based gradient compression for deep learning (DL) in Artificial Intelligence (AI) in cloud computing environment, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
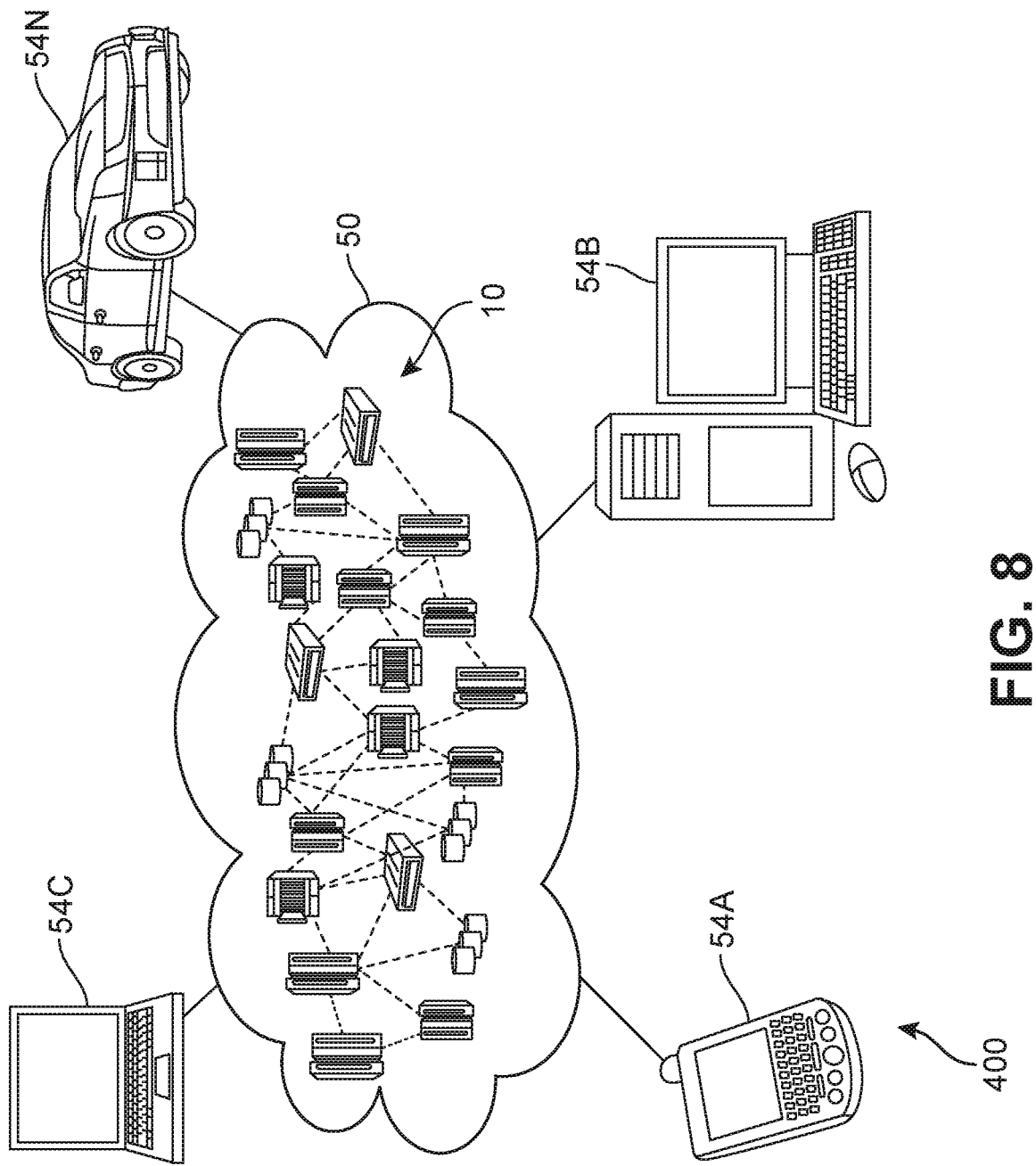
FIG. 8 depicts a cloud computing environment according to an embodiment of the present disclosure.

Referring now to FIG. 8, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 10 and cloud computing environment 50 can communicate with any type of computerized device over any type of network and/or network addressable connection (e.g., using a web browser).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for gradient data compression for distributed deep learning with a plurality of computing nodes, the method comprising:
    eliminating metadata associated with sparse encoding for deep learning pipelines utilizing allreduce operations, wherein eliminating metadata comprises:
        generating a predetermined matrix and a degree of data compression k as a dimension of the predetermined matrix for the plurality of computing nodes, wherein k is adjusted by available network bandwidth;
        receiving by each computing node a corresponding matrix of the matrices to be reduced;
        decomposing each corresponding matrix into a plurality of non-fixed matrices and the predetermined matrix;
        summing the plurality of non-fixed matrices to provide an optimized matrix, which is multiplied by the predetermined matrix to provide a result matrix;
        designating the optimized matrix as the predetermined matrix; and
        iteratively performing the operations of receiving, decomposing, summing and designating until all of the matrices received by the computing nodes have been allreduced and the distributed deep learning is complete.

2. The computer implemented method of claim 1, wherein the predetermined matrix is generated by a pseudo random number generator.

3. The computer implemented method of claim 1, wherein the degree of data compression k is one of 8, 16, 32, 128, and 256.

4. The computer implemented method of claim 1, wherein the degree of data compression k is a dimension of each non-fixed matrix.

5. The computer implemented method of claim 1, wherein each matrix to be allreduced has an m×n dimension.

6. The computer implemented method of claim 1, wherein each non-fixed matrix has a dimension m×k.

7. The computer implemented method of claim 1, wherein the optimized matrix has a dimension n×k.

8. The computer implemented method of claim 1, wherein each computing node is included in a cloud environment.

9. A system comprising:
a device processor; and
a computer readable storage medium storing instructions that are executable by the device gradient data compression for distributed deep learning from a plurality of computing nodes by:
eliminating metadata associated with sparse encoding for deep learning pipelines utilizing allreduce operations, wherein eliminating metadata comprises:
generating a predetermined matrix and a degree of data compression k as a dimension of the predetermined matrix for the plurality of computing nodes, wherein k is adjusted by available network bandwidth;
receiving by each computing node a corresponding matrix of the matrices to be reduced;
decomposing each corresponding matrix into a plurality of non-fixed matrices and the predetermined matrix;
summing the plurality of non-fixed matrices to provide an optimized matrix, which is multiplied by the predetermined matrix to provide a result matrix;
designating the optimized matrix as the predetermined matrix; and
iteratively performing the operations of receiving, decomposing, summing and designating until all of the matrices received by the computing nodes have been allreduced and the distributed deep learning is complete.

10. The system of claim 9, wherein the predetermined matrix is generated by a pseudo random number generator.

11. The system of claim 9, wherein the degree of data compression k is one of 8, 16, 32, 128, and 256.

12. The system of claim 9, wherein the degree of data compression k is a dimension of each non-fixed matrix.

13. The computer implemented method of claim 9, wherein each matrix to be allreduced has an m×n dimension.

14. The system of claim 9, wherein each non-fixed matrix to be reduced has an m×n dimension.

15. The system of claim 9, wherein the optimized matrix has a dimension n×k.

16. The system of claim 9, wherein each computing node is included in a cloud environment.

17. A computer program product comprising:
a computer readable storage medium storing instructions that are executable by the device gradient data compression for distributed deep learning from a plurality of computing nodes by:
eliminating metadata associated with sparse encoding for deep learning pipelines utilizing allreduce operations, wherein eliminating metadata comprises:
generating a predetermined matrix and a degree of data compression k as a dimension of the predetermined matrix for the plurality of computing nodes, wherein k is adjusted by available network bandwidth;
receiving by each computing node a corresponding matrix of the matrices to be reduced;
decomposing each corresponding matrix into a plurality of non-fixed matrices and the predetermined matrix;
summing the plurality of non-fixed matrices to provide an optimized matrix, which is multiplied by the predetermined matrix to provide a result matrix;
designating the optimized matrix as the predetermined matrix; and
iteratively performing the operations of receiving, decomposing, summing and designating until all of the matrices received by the computing nodes have been allreduced and the distributed deep learning is complete.

18. The computer program product of claim 17, wherein each non-fixed matrix to be reduced has an m×n dimension.

19. The computer program product of claim 17, wherein the optimized matrix has a dimension n×k.

20. The computer program product of claim 17, wherein each computing node is included in a cloud environment.

* * * * *